United States Patent
Catalano

(10) Patent No.: US 11,077,401 B2
(45) Date of Patent: Aug. 3, 2021

(54) SEPARATED GAS STREAM POINT OF USE ABATEMENT DEVICE

(71) Applicant: HIGHVAC CORPORATION, Colorado Springs, CO (US)

(72) Inventor: Philip J. Catalano, Dallas, TX (US)

(73) Assignee: HIGHVAC CORPORATION, Colorado Springs, CO (US)

( * ) Notice: Subject to any disclaimer, the term of this patent is extended or adjusted under 35 U.S.C. 154(b) by 189 days.

(21) Appl. No.: 16/412,384

(22) Filed: May 14, 2019

(65) Prior Publication Data
US 2019/0351369 A1      Nov. 21, 2019

Related U.S. Application Data

(60) Provisional application No. 62/672,249, filed on May 16, 2018.

(51) Int. Cl.
| | | |
|---|---|---|
| *B01D 53/14* | (2006.01) | |
| *B01D 53/18* | (2006.01) | |
| *B01D 53/38* | (2006.01) | |
| *B01D 53/75* | (2006.01) | |

(52) U.S. Cl.
CPC ......... *B01D 53/75* (2013.01); *B01D 53/1406* (2013.01); *B01D 53/18* (2013.01); *B01D 53/38* (2013.01); *B01D 2258/0216* (2013.01)

(58) Field of Classification Search
CPC .... B01D 53/1406; B01D 53/38; B01D 53/75; B01D 53/78; B01D 53/18; B01D 2258/0216; B01D 53/005; B01D 2221/08; B01D 2258/0283; B01D 2259/4558; B01D 2259/4541; B01D 2259/455; B01J 2219/0004
See application file for complete search history.

(56) References Cited

U.S. PATENT DOCUMENTS

| | | |
|---|---|---|
| 2005/0147509 A1 | 7/2005 | Bailey et al. |
| 2005/0241763 A1 | 11/2005 | Huang et al. |
| 2007/0086931 A1 | 4/2007 | Raoux et al. |
| 2011/0289751 A1* | 12/2011 | Ammons ................ F23J 15/06 29/428 |

(Continued)

FOREIGN PATENT DOCUMENTS

KR      10-2011-0082279 A      7/2011

OTHER PUBLICATIONS

International Search Report and Written Opinion dated Sep. 6, 2019 for PCT Application No. PCT/US2019/032563.

*Primary Examiner* — Timothy C Vanoy
(74) *Attorney, Agent, or Firm* — Moser Taboada

(57) ABSTRACT

Embodiments of point-of-use (POU) abatement device and methods of abating a plurality of gas streams from a corresponding plurality of processing chambers are provided herein. In some embodiments, a compact POU abatement device includes a plurality of inlets respectively coupled to a plurality of process chambers in which each of the process chambers gas streams is isolated from the other gas streams. In some embodiments, the compact POU abatement device can include a plurality of oxidation devices and a corresponding plurality of wet scrubber columns each directly coupled to ones of the plurality of inlets to receive a gas stream from a corresponding process chamber.

20 Claims, 6 Drawing Sheets

(56) References Cited

U.S. PATENT DOCUMENTS

| | | | |
|---|---|---|---|
| 2014/0050624 A1* | 2/2014 | Archuleta | B01D 53/0407 422/119 |
| 2016/0001214 A1* | 1/2016 | Chen | B01D 50/008 422/122 |
| 2016/0281234 A1 | 9/2016 | Won et al. | |
| 2018/0243461 A1* | 8/2018 | Lee | B01D 53/78 |

* cited by examiner

SEPARATED GAS STREAM POINT OF USE ABATEMENT DEVICE

CROSS-REFERENCE TO RELATED APPLICATIONS

This application claims benefit of U.S. provisional patent application Ser. No. 62/672,249, filed May 16, 2018 which is herein incorporated by reference in its entirety.

FIELD

Embodiments of the present disclosure generally relate to abatement devices used in connection with thin film fabrication processes.

BACKGROUND

In recent years, manufacturers and operators of semiconductor processing apparatus have developed process chamber cleaning methods that utilize "clean" gases. One such clean gas that has become a commonly utilized option is nitrogen trifluoride ($NF_3$). When employed with a remote plasma clean (RPC) device, the $NF_3$ is effectively converted (at a rate of approximately 98.2%) to create fluorine ($F_2$).

In the case of a silicon nitride CVD process that is operating on a cluster tool, silane ($SiH_4$) and ammonia ($NH_3$) are flowed during deposition step at the same time to form silicon nitride ($Si_3N_4$) layers on wafers.

Typically, after each process run the process chamber is cleaned, with fluorine being injected into the process chamber from plasma reaction of $NF_3$. As a result of cleaning the process chamber that was utilized for a silicon nitride process, other byproduct gases including hydrogen fluoride (HF), and silicon tetrafluoride ($SiF_4$) may be formed.

In both cases above (the process chamber clean process and the deposition process), varying amounts of the gases utilized and resulting "by-product" gases emit from the process chamber. These gases are exhausted from the respective process chambers via dedicated vacuum pumps connected to each process chamber.

When the gases from one or more process chambers running a clean process and the gases from other process chambers running the deposition process are commingled in a common exhaust line or abatement device downstream of the vacuum pumps, additional by-products known as ammonium compounds are created including ammonium fluoride ($NH_4F$) and ammonium hexafluorosilicate (($NH_4)_2SiF_6$). These compounds can be formed in voluminous amounts causing significant maintenance requirements for cleaning of the exhaust line or abatement device, ultimately resulting in loss of production time to the cluster tool and significant losses of potential revenue to the manufacturing line.

Existing POU abatement devices utilize a common oxidation chamber and downstream wet scrubber section (if equipped) wherein all exhaust streams emitting from each process chamber's vacuum pump are joined together. These devices can allow creation of such ammonium compounds when the gases from process chambers running a deposition process and gases running a clean step are commingled. The creation of such ammonium compounds could occur in the oxidation chamber or in the wet scrubber section, or both.

The inventor believes that to most effectively avoid the creation of such ammonium compounds, the effluent from multiple process chambers, for example configured as part of a cluster tool, ideally require total separation through the point that they are sufficiently abated via oxidation and scrubber devices as appropriate in order to reduce and or eliminate the development of such ammonium compounds. One solution for this problem would be to maintain a dedicated POU abatement system for each process chamber, however this would be unrealistic from a capital cost perspective and from a space consumption perspective. Such a solution would therefore be rendered to be economically unfeasible, most specifically due to the cost of the space that would be required in a modern semiconductor fabrication facility to employ individual POU abatement devices for each process chamber.

The above example is one of many applications that can benefit from the following disclosure. However, the present disclosure is not limited to this specific application.

Therefore, the inventor has provided improved abatement devices.

SUMMARY

Embodiments of POU abatement devices are provided herein. In some embodiments, a compact POU abatement device includes a plurality of inlets respectively coupled to a plurality of process chambers in which each of the process chamber gas streams is isolated from the other chamber gas streams. In some embodiments, the compact POU abatement device can include a plurality of oxidation devices and a corresponding plurality of isolated wet scrubber columns each directly coupled to a respective one of the plurality of inlets to receive a gas stream from a corresponding process chamber.

In some embodiments, a point of use (POU) abatement device includes: a housing having a plurality of independent flow paths, each independent flow path defined by a corresponding inlet, flow path, and outlet within the housing and configured to facilitate flowing separated gas streams through the respective independent flow paths; and a one or more completely separated destruction or removal devices disposed within each flow path within the housing; wherein the plurality of independent flow paths are configured to maintain complete separation of respective gas streams flowing through the POU abatement device.

In some embodiments, a compact POU abatement device can include a plurality of primary co-current flow (i.e., flow in same direction) wet scrubber columns directly connected to a plurality of oxidation devices and a corresponding plurality of downstream isolated wet scrubber columns each directly coupled to a respective one of the plurality of inlets to receive a gas stream from a corresponding process chamber.

In some embodiments, a compact POU abatement device can include a plurality of primary counter-current flow (i.e., flow in opposite directions) wet scrubber columns directly connected to a plurality of oxidation devices and a corresponding plurality of downstream isolated wet scrubber columns each directly coupled to a respective one of the plurality of inlets to receive a gas stream from a corresponding process chamber.

Any of the above embodiments can include a plurality of primary inlets in a primary flow path and a bypass or diverter valve to divert the gas stream to a corresponding secondary inlet of a redundant flow path.

In some embodiments, a method of abating a plurality of gas streams from a corresponding plurality of processing chambers includes: flowing a plurality of independent gas streams from a plurality of processing chambers into a plurality of independent flow paths of a housing of a point of use (POU) abatement device; at least partially abating compounds within each independent gas stream by flowing each of the plurality of independent gas streams through respective destruction or removal devices disposed within each flow path while maintaining each of the plurality of independent gas streams completely separated; and exhausting each of the abated independent gas streams from the housing of the POU abatement device.

The foregoing summary of certain features and embodiments disclosed herein is not intended to be limiting. Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
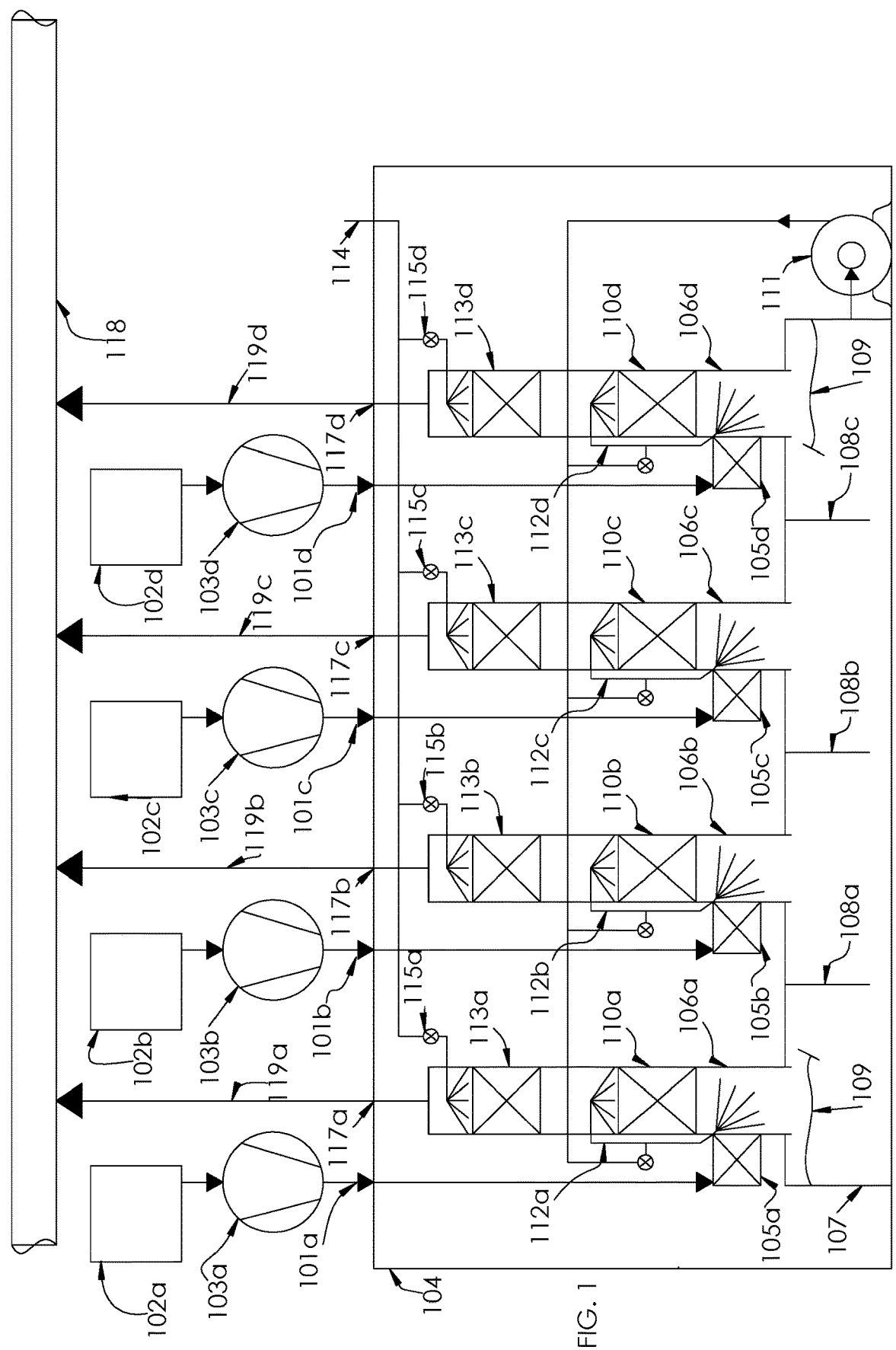
FIG. 1 through FIG. 6 are schematic side views of embodiments of a point of use abatement device in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of point of use (POU) abatement devices are provided herein. Embodiments of the disclosed POU abatement devices advantageously maintain total separation of effluent streams from different process chambers, such as semiconductor process chambers, until the effluent streams are sufficiently abated, thereby reducing and/or eliminating the development of unwanted byproducts. Production uptime can be significantly increased by reducing the mean time between POU abatement device and exhaust duct cleaning due to unwanted byproducts.

FIG. 1 through FIG. 6 are schematic side views of a point of use abatement device in accordance with at least some embodiments of the present disclosure. Although FIG. 1 through FIG. 6 depict four inlets (inlets 101a to 101d), the number of inlets can be increased or decreased according to demand or economic feasibility for a particular application. The point of use (POU) abatement device generally includes a housing having a plurality of independent flow paths. Each independent flow path is defined by a corresponding inlet, flow path, and outlet within the housing. Each independent flow path is configured to facilitate flowing separated gas streams through the respective independent flow paths. One or more completely separated destruction or removal devices is disposed within each flow path within the housing. The plurality of independent flow paths are configured to maintain complete separation of respective gas streams flowing through the POU abatement device.

An exemplary POU abatement device is illustrated in FIG. 1 that incorporates two or more independent flow paths having inlets (four inlets 101a to 101d shown) whereas the plurality of independent flow paths maintain a total separation of gas streams from each other. Each of the plurality of inlets 101a to 101d and respective gas stream incorporates one or more abatement devices, such as oxidation and wet scrubbing devices, while maintaining total separation of the gas streams from other process chambers 102a to 102d and inlets 101a to 101d. For example, gases exhausted from the respective process chambers 102a to 102d via dedicated vacuum pumps 103a to 103d respectively connected to each of the process chambers 102a to 102d are provided independently to each inlets 101a to 101d of the POU gas abatement device. The system can be utilized for the effective abatement of gases as exhausted from process chambers 102a to 102d, such as but not limited to PECVD (Plasma Enhanced Chemical Vapor Deposition) where unwanted byproducts, such as ammonium compounds, are potentially created as a result of mixing of the process chemistries and the process chambers clean chemistries and with the byproducts that are created during the function of cleaning the process chambers 102a to 102d with the clean gas chemistries. Most specifically, but not exclusively, the system will be most effective in semiconductor processing apparatus that employs a plurality of process chambers 102a to 102d (often grouped together in a configuration commonly known as "cluster tools") that may be processing different gas chemistries at any given time. In many cases these different chemistries can react when mixed and create unwanted byproducts. Therefore it is advantageous to treat them separately prior to mixing the gas streams in the exhaust ducting.

An advantage of embodiments of the present disclosure, as illustrated in FIG. 1, is reduction and or elimination of the development of unwanted byproducts, by maintaining total separation of the individual gas streams from the separate process chambers 102a to 102d. This is accomplished by incorporating a plurality of isolated gas streams encompassed in a POU abatement device having a common enclosure or housing 104 in which each isolated gas stream has a dedicated oxidizer 105a to 105d (e.g., a pyrolytic oxidizer, or burner) for each of the plurality of inlets 101a to 101d.

The oxidizers 105a to 105d are directly connected to corresponding dedicated and separate wet scrubber columns 106a to 106d. The wet scrubber columns 106a to 106d are directly connected to a common wet scrubber solution recirculation sump, or reservoir (common recirculation sump, or common reservoir 107). The common reservoir 107 incorporates dividing walls 108a to 108c that extend from the top of the common reservoir 107 to a point below the scrubber solution fluid level 109 as to maintain a complete separation of the individual gas streams. The wet scrubber solution may be any process compatible neutralizing agent, such as water or the like.

The plurality of wet scrubber columns 106a to 106d incorporate a plurality of primary wet scrubber sections 110a to 110d that is of a packed bed counter-current flow type, supported via a common recirculation pump 111 that delivers recirculated scrubber solution to each of the plurality of primary wet scrubber sections 110a to 110d via a plurality of spray nozzles 112a to 112d for the purpose of primary wet scrubber of the exhaust gas stream.

Figure 2:
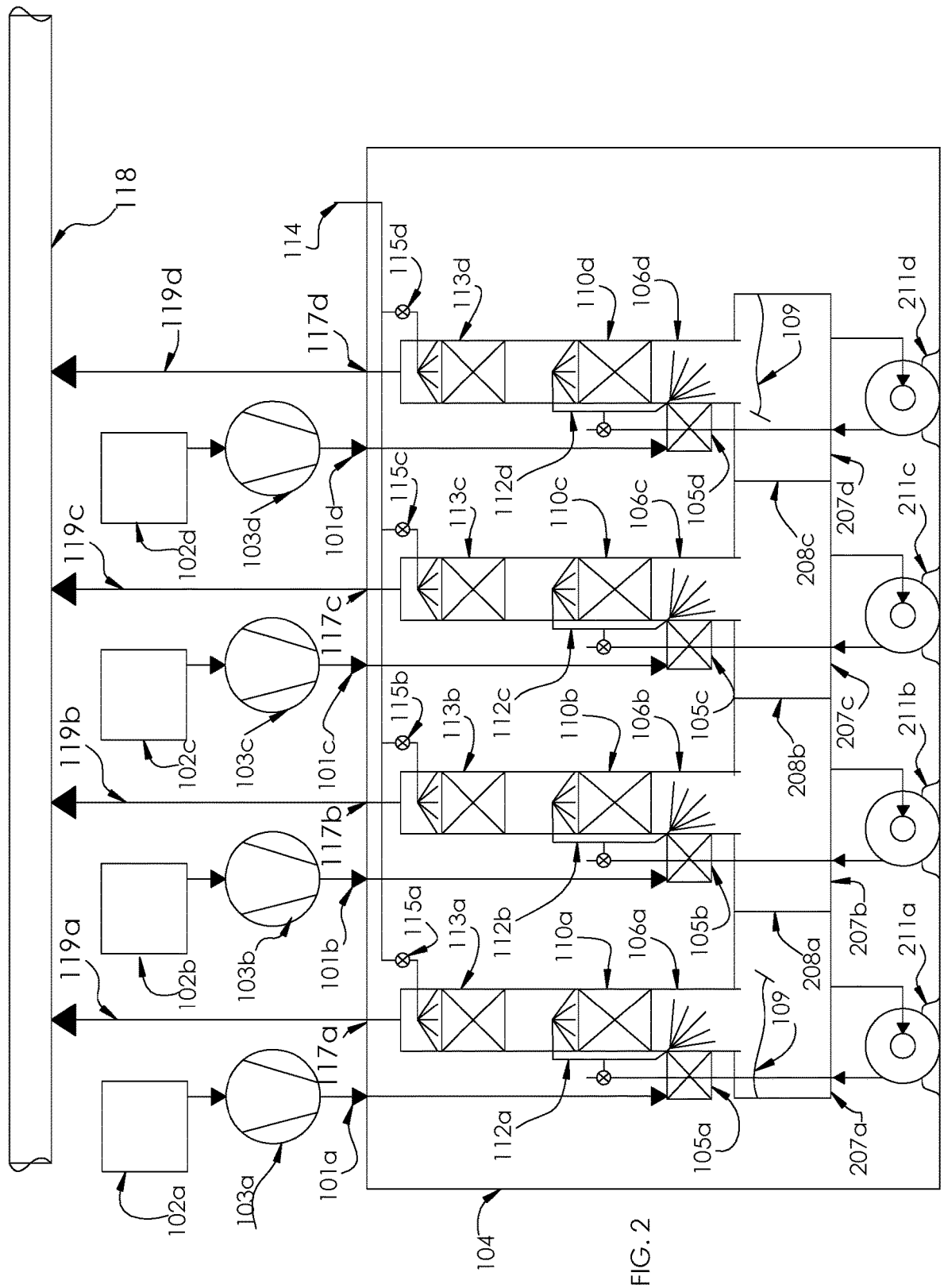

In certain applications it may be advantageous to maintain separation of the recirculation solution. As depicted in FIG. 2, an alternative to the common reservoir 107, and common recirculation pump 111 as depicted in FIG. 1, is to incorporate dividing walls 208a to 208c that extend to the bottom of the reservoir to maintain gas and recirculation solution separation. This configuration creates independent recirculation sumps, or reservoirs 207a to 207d and utilizes dedicated recirculation pumps 211a to 211d.

Returning to FIG. 1, the wet scrubber columns 106a to 106d can also incorporate a plurality of secondary wet scrubber sections 113a to 113d directly connected to and downstream of the primary wet scrubber sections 110a to 110d The secondary wet scrubber sections 113a to 113d are supported by a flow of fresh water supply 114 (or supply of other suitable neutralizer) that can be utilized to scrub acids from the effluent flow, and as make-up water (or other suitable neutralizer solution) to replenish the scrubber solution from the common reservoir 107 or individual reservoirs 207a to 207d as it constantly drains to—maintain the pH level of the scrubber solution. The fresh water supply 114 can be controlled via a plurality of flow control valves 115a to 115d and input from the HMI (Human/Machine Interface) controls (e.g., a controller) to reduce the flow at times that pH control is not required on the plurality of wet scrubber columns 106a to 106d. Flow control valves 115a to 115d can include a restrictive flow metering device to optimize fresh water flow in each isolated independent flow path.

The plurality of oxidizers 105a to 105d can be directly connected to a plurality of wet scrubber columns 106a to 106d as outlined above serve to create a plurality of isolated gas streams for the effective abatement of process gas and remote plasma clean (RPC) clean gas effluents. The individual, dedicated, and totally separated gas stream abatement devices are housed in a common enclosure (e.g., housing 104) and share common controls and HMI, and as mentioned above, share a common reservoir 107 or individual reservoirs 207a to 207d that is utilized for the recirculation of a wet scrubber solution.

The abated gas stream from each wet scrubber column 106a to 106d has its own individual connection 117a to 117d at exit of housing 104, which are connected to facility exhaust duct 118 through individual ducts 119a to 119d.

The oxidizers 105a to 105d, which in the present form are of pyrolytic type, can be substituted by other such oxidizing device such as dynamic oxidation chambers or plasma reaction chamber of either RF or microwave power source. In the case of pyrolytic type, the oxidizers 105a to 105d fuel source can be either hydrogen, methane, or other gaseous fossil fuel. In addition to substitution of oxidizing method, the plurality of individual and isolated gas streams can incorporate an upstream co-current flow or counter-current flow type wet scrubber section as depicted in FIG. 3 and FIG. 4 respectively, to provide for a plurality of isolated gas streams that provide for a wet/burn/wet POU abatement device that maintains total separation of a plurality of gas streams from multiple process chambers 102a to 102d.

Figure 3:
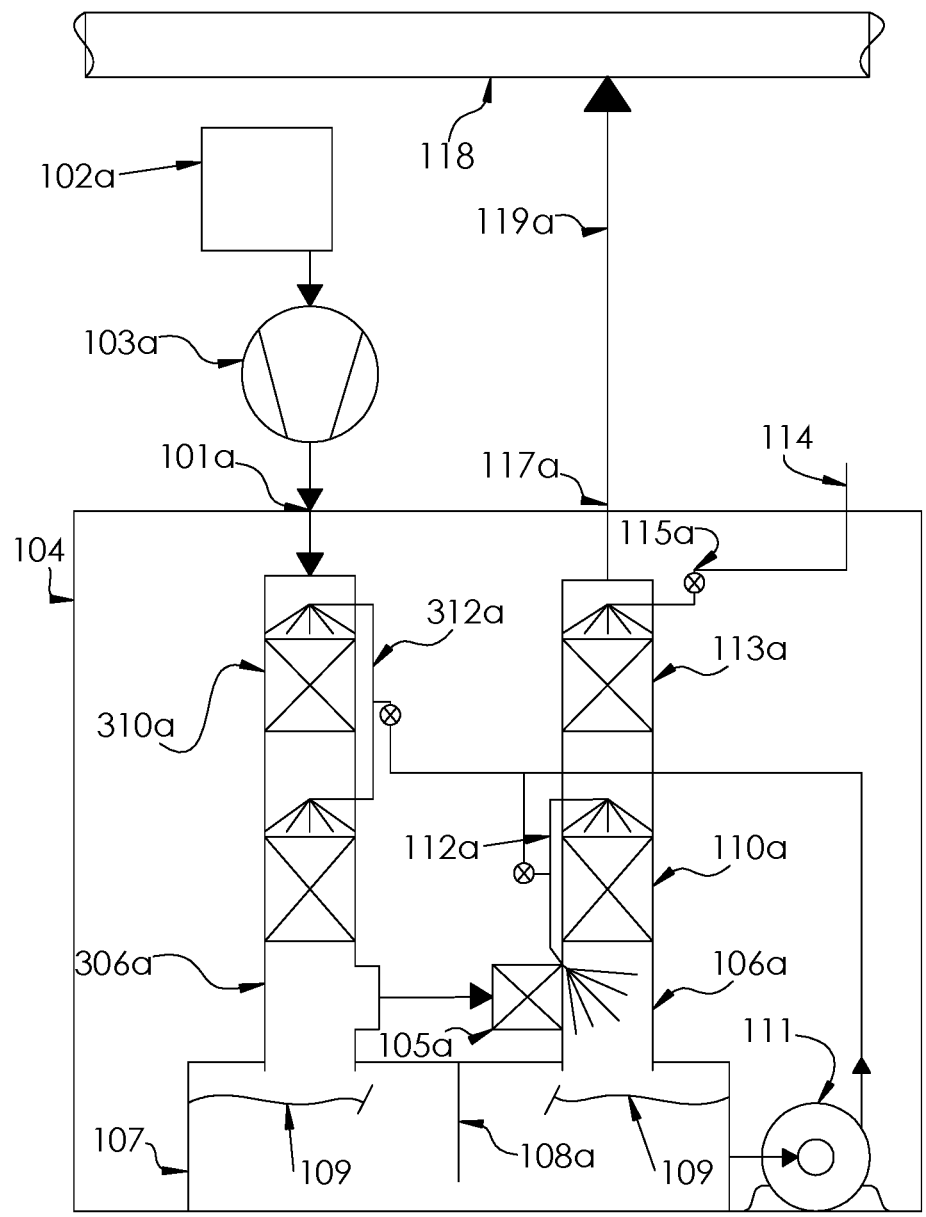

To simplify FIG. 3, only one of the plurality of potential inlets and separate gas paths has been depicted. Gases exhausted from the respective process chamber 102a via dedicated vacuum pump 103a respectively connected to process chamber 102a are provided independent inlet 101a of the POU gas abatement device. For inlet 101a the gases are first routed through a co-current flow wet scrubber column 306a with a packed bed scrubber 310a fed by recirculated solution spray nozzles 312a. the outlet of scrubber column 306a is directly connected to oxidizer 105a, which is directly connected to corresponding dedicated downstream wet scrubber column 106a. In some embodiments, the packed bed scrubber 310a may have multiple packing sections and multiple recirculated spray nozzles 312a.

Figure 4:
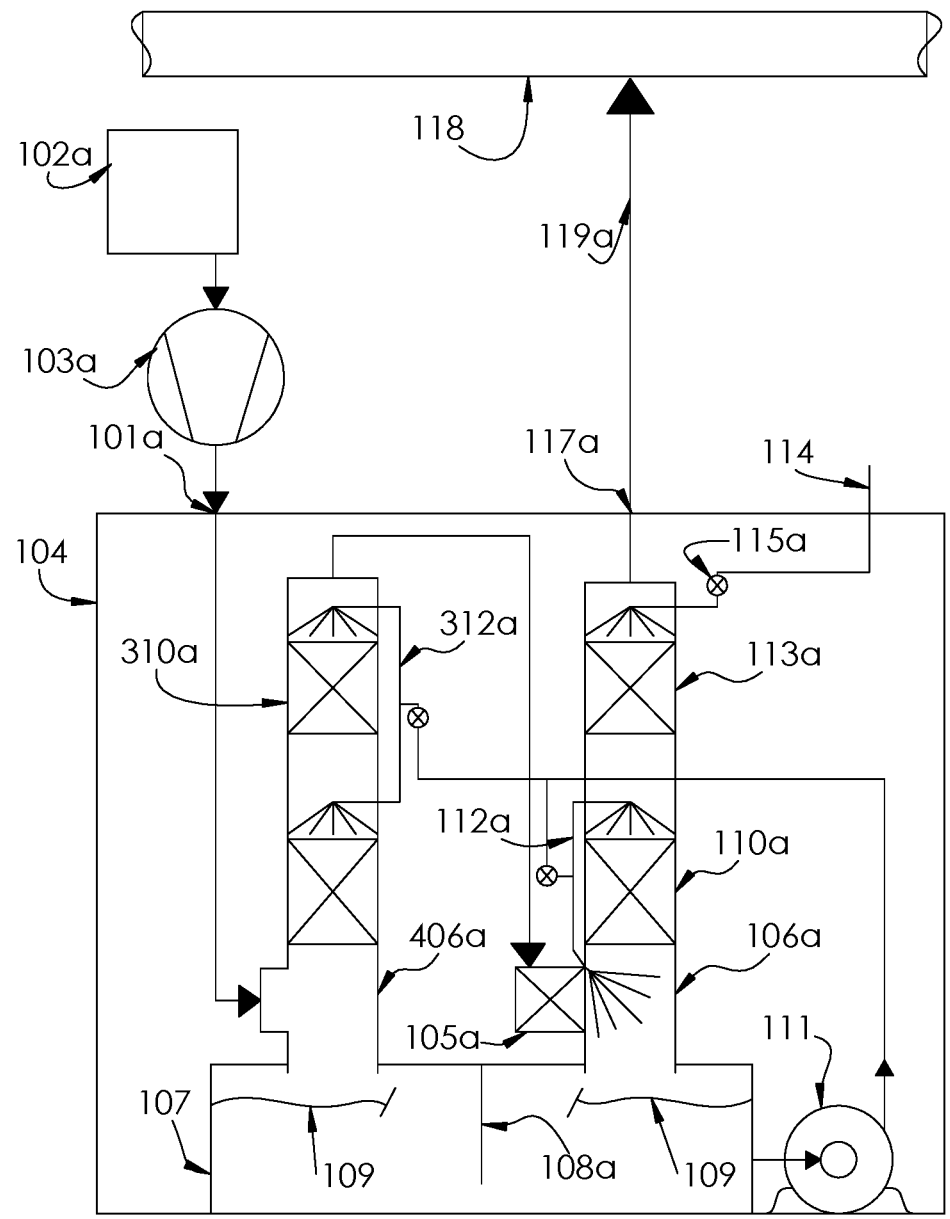

To simplify FIG. 4, only one of the plurality of potential inlets and separate gas paths has been depicted. Gases exhausted from the respective process chamber 102a via dedicated vacuum pump 103a respectively connected to process chamber 102a are provided independent inlet 101a of the POU gas abatement device. For inlet 101a the gases are first routed through a counter-current flow wet scrubber column 406a with a packed bed scrubber 310a fed by recirculated solution spray nozzles 312a. The outlet of scrubber column 306a is directly connected to oxidizer 105a, which is directly connected to corresponding dedicated downstream wet scrubber column 106a.

Figure 5:
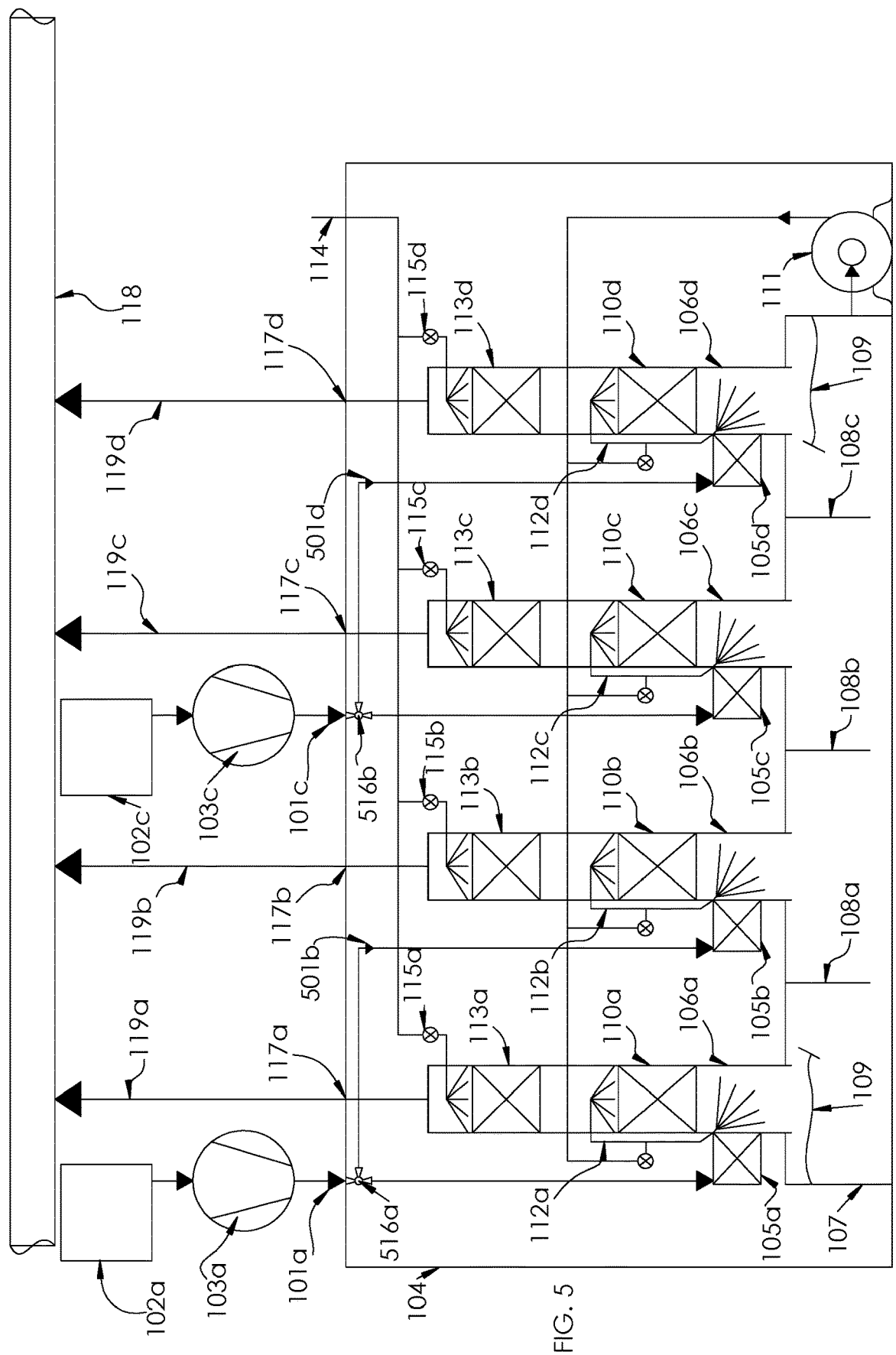

In some embodiments, one or more of the independent flow paths can include a pair of flow paths configured as a primary flow path and a redundant flow path. For example, FIG. 5 depicts the disclosed embodiment of FIG. 1 with the added ability to utilize subsequent inlets 501b and 501d as redundant backups to primary inlets (e.g., inlets 101a and 101c). This is accomplished with bypass, or diverter valves 516a and 516b configured to selectively bypass the primary flow path and divert the gas stream to the redundant flow path. For simplification of FIG. 5 only two process chambers, 102a and 102c, gas streams are depicted as well as two POU abatement device inlets 101a and 101c. As mentioned for previous Figures, FIG. 5 can also be expanded beyond the two inlets 101a and 101c as depicted.

In use, for example if one or more of the destruction or removal devices in a primary flow path fails, malfunctions, or otherwise operates out of specification, a first gas stream of a plurality of independent gas streams flowing through the POU abatement device can be diverted from the primary flow path to a redundant flow path using the diverter valve (e.g., diverter valve 516a). As depicted above, the redundant flow path is disposed within the housing and includes one or more destruction or removal devices to at least partially abate compounds within the independent gas stream flowing through the redundant flow path.

Figure 6:
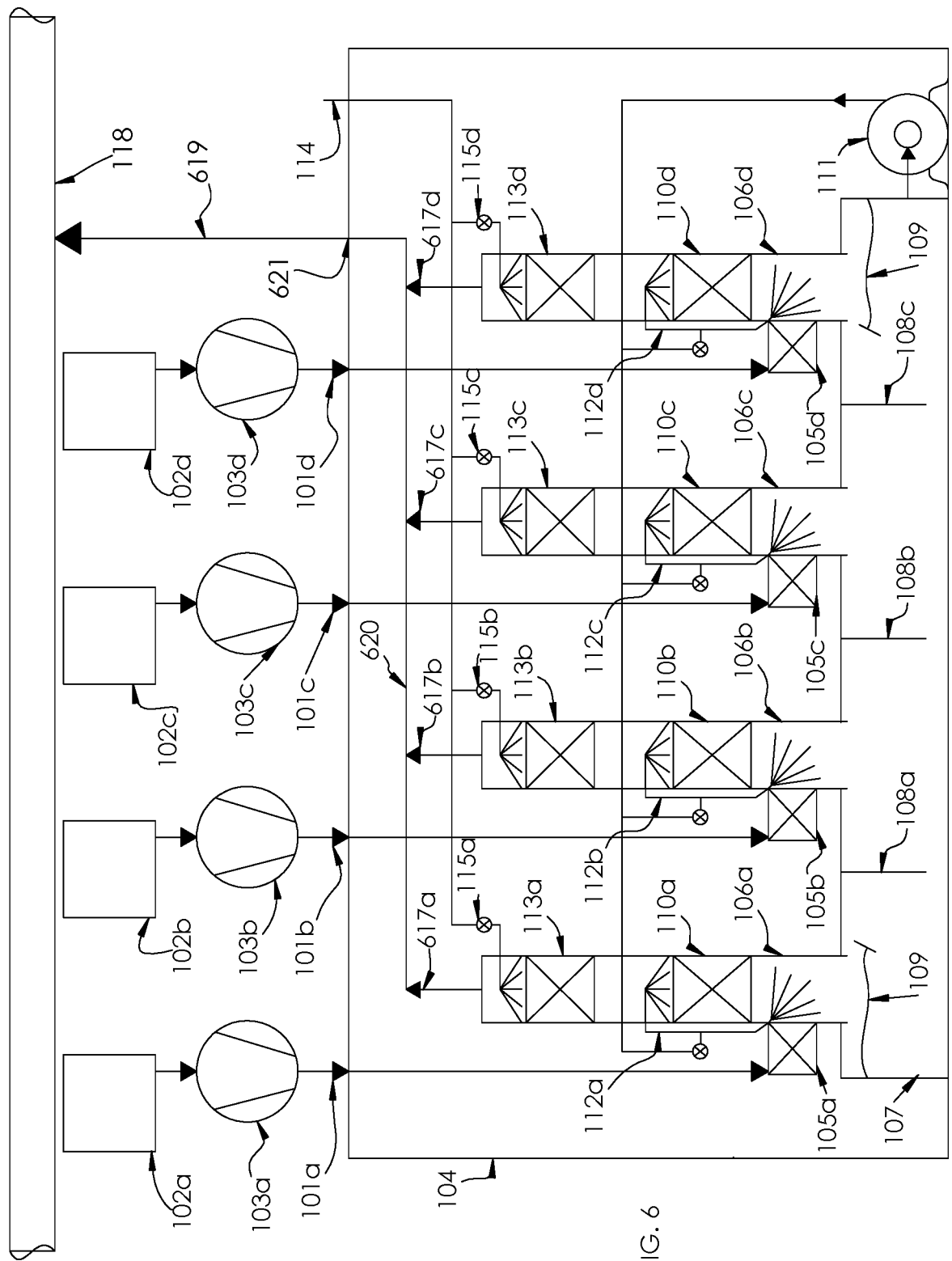

The embodiment depicted in FIG. 6 comprises an internal exhaust manifold 620 utilized to connect all wet scrubber outlets 617a to 617d to a common outlet 621, at exit of housing 104, by way of a common duct 619 that connects the POU abatement exhaust to a single connection to facility exhaust duct 118. The internal exhaust manifold 620 can be incorporated in all of the outlined embodiments as depicted in FIG. 1 through FIG. 5.

The POU abatement device as described above effectively maintains complete separation of the gases from the process chambers 102a to 102d until such a time that the gases have been effectively abated through an oxidation device (e.g., oxidizers 105a to 105d) and a wet scrubber device (e.g., wet scrubber columns 106a to 106d). Although the above description illustrates a POU abatement device configured to create and process four separated gas streams, fewer or greater numbers of separated gas streams can be created and processed.

Examples of embodiments of the POU abatement device as described herein are provided below.

A compact POU abatement device with a plurality of inlets 101a to 101d for multiple process chambers 102a to 102d in which each of the process chambers gas streams is isolated from the other gas streams. The process chambers 102a to 102d can be semiconductor process chambers configured to perform processes, such as deposition processes, on semiconductor wafers or the like.

A compact POU abatement device with a plurality of inlets 101a to 101d that allows for a plurality of isolated gas streams that incorporates a plurality of oxidizers 105a to 105d of which are directly connected to a plurality of wet scrubber columns 106a to 106d that incorporate a plurality of primary wet scrubber sections 110a to 110d and a plurality of secondary wet scrubber sections 113a to 113d in the plurality of isolated gas streams A compact POU abatement device in which each of the plurality of inlets 101a to 101d of the abatement device and the plurality of isolated gas streams incorporates a plurality of oxidizers 105a to 105d combined with a dedicated wet scrubber column 106a to 106d to create an isolated and dedicated gas stream for each of the plurality of process chambers 102a to 102d that are exhausting into the plurality of inlets 101a to 101d.

A compact POU abatement device in which the plurality of gas streams are totally separated from each other until they have been treated through a plurality of oxidizers 105a to 105d and a plurality of primary wet scrubber sections 110a to 110d and a plurality of secondary wet scrubber sections 113a to 113d.

A compact POU abatement device in which the plurality of individual gas stream(s) are housed in a common housing 104, of which there can be a plurality of inlets 101a to 101d supporting a plurality of individual and dedicated gas streams.

A compact POU abatement device in which the plurality of inlets 101a to 101d and isolated gas streams share a common recirculation pump 111.

A compact POU abatement device in which the plurality of inlets 101a to 101d and plurality of isolated gas streams share a common reservoir 107.

A compact POU abatement device in which the plurality of inlets 101a to 101d and plurality of isolated and individual gas streams share a common control panel/HMI.

A compact POU abatement device in which the plurality of inlets 101a to 101d receive gas streams from a plurality of process chambers 102a to 102d in which a plurality of wet scrubber columns 106a to 106d are directly joined to the common reservoir 107 at the top of common reservoir 107.

A compact POU abatement device in which the plurality of inlets 101a to 101d and individual gas streams share a common reservoir 107 and the common reservoir 107 incorporates dividing walls 108a to 108c between each individual and isolated gas stream column inlets 101a to 101d and the dividing walls 108a to 108c extend below the wet scrubber solution fluid level 109 to point below the expected static pressure of the wet scrubber columns 106a to 106d to effect a complete separation of the plurality of isolated and individual gas streams. The dividing walls 108a to 108c terminate above the base of the common reservoir 107 to enable flow of the wet scrubber fluid solution (from each of the plurality of individual and isolated gas stream's plurality of primary wet scrubber sections 110a to 110d and plurality of secondary wet scrubber sections 113a to 113d) throughout the common reservoir 107 and allows for a central drain of the wet scrubber solution either via gravity drain or pumped drain.

A compact POU abatement device in which the plurality of individual and isolated gas streams plurality of wet scrubber columns 106a to 106d incorporate a plurality of secondary wet scrubber sections 113a to 113d that utilizes fresh water supply 114 to support the plurality of secondary wet scrubber sections 113a to 113d and the fresh water supply 114 is independently controlled on each of the plurality of secondary wet scrubber sections 113a to 113d with a plurality of flow control valves 115a to 115d via input from the common HMI controls to reduce fresh water consumption during reduced needs of acidic abatement of each of the plurality of individual gas streams. Flow control valves 115a to 115d can include a restrictive flow metering device to optimize fresh water flow in each isolated independent flow path.

While the foregoing is directed to embodiments of the present disclosure, other and further embodiments of the disclosure may be devised without departing from the basic scope thereof.

What is claimed is:

1. A point of use (POU) abatement device, comprising:
    a housing having a plurality of independent flow paths, each independent flow path defined by a corresponding inlet, flow path, and outlet within the housing and configured to facilitate flowing separated gas streams through the respective independent flow paths; and
    a one or more completely separated destruction or removal devices disposed within each flow path within the housing;
    wherein the plurality of independent flow paths are configured to maintain complete separation of respective gas streams flowing through the POU abatement device.

2. The POU abatement device of claim 1, wherein the one or more completely separated destruction or removal devices comprises an oxidation device and a wet scrubber column.

3. The POU abatement device of claim 1, further comprising:
    a common recirculation sump and recirculation pump to support a plurality of wet scrubber sections for each of the plurality of independent flow paths; and
    a plurality of dividing walls extending into the common recirculation sump to a point below a fluid level of the common recirculation sump without contacting a bottom of the common recirculation sump to maintain complete separation of the gas streams above the fluid level of the common recirculation sump.

4. The POU abatement device of claim 1, further comprising:
    a plurality of independent recirculation sumps and recirculation pumps to support one or more wet scrubber sections for each of the plurality of independent flow paths.

5. The POU abatement device of claim 1, wherein the one or more completely separated destruction or removal devices comprises:
    a plurality of oxidation devices directly connected to a plurality of wet scrubber sections for each of the plurality of independent flow paths.

6. The POU abatement device of claim 1, wherein the one or more completely separated destruction or removal devices comprises:
    a wet scrubber column for each of the plurality of independent flow paths.

7. The POU abatement device of claim 6, further comprising:
    a plurality of independent control valves for each of the wet scrubber columns.

8. The POU abatement device of claim 6, wherein each of the wet scrubber columns comprise a recirculated scrubber section and a downstream fresh solution scrubber section.

9. The POU abatement device of claim 8, further comprising:
    a plurality of independent control valves for each independent fresh scrubber of each independent flow path, each independent control valve comprising individual flow restriction valves and control via a common controller.

10. The POU abatement device of claim 1, wherein each of the one or more completely separated destruction or removal devices is controlled via a common controller.

11. The POU abatement device of claim 1, wherein the plurality of independent flow paths are arranged into pairs of primary and redundant flow paths, and further comprising:
a bypass/diverter valve and associated plumbing for each pair of the plurality of independent flow paths to selectively bypass the primary flow path to the corresponding redundant flow path.

12. The POU abatement device of claim 11, wherein each bypass/diverter valve is mounted internal to the housing.

13. The POU abatement device of claim 1, wherein the one or more completely separated destruction or removal devices comprises:
a primary wet scrubber section, an oxidation device, and a secondary wet scrubber section.

14. The POU abatement device of claim 13, wherein the primary wet scrubber section is configured to operate in a co-current flow configuration, and wherein the secondary wet scrubber section is configured to operate in a counter-current flow configuration.

15. The POU abatement device of claim 13, wherein the primary wet scrubber section and the secondary wet scrubber section are each configured to operate in a counter-current flow configuration.

16. The POU abatement device of claim 13, further comprising:
a recirculation sump coupled to the primary wet scrubber section.

17. The POU abatement device of claim 13, wherein the secondary wet scrubber section comprises:
a dual secondary wet scrubber section having a first section coupled to a recirculation sump and a downstream second section coupled to a fresh solution supply.

18. A method of abating a plurality of gas streams from a corresponding plurality of processing chambers, comprising:
flowing a plurality of independent gas streams from a plurality of processing chambers into a plurality of independent flow paths of a housing of a point of use (POU) abatement device;
at least partially abating compounds within each independent gas stream by flowing each of the plurality of independent gas streams through respective destruction or removal devices disposed within each flow path while maintaining each of the plurality of independent gas streams completely separated; and
exhausting each of the abated independent gas streams from the housing of the POU abatement device.

19. The method of claim 18, wherein the at least partially abating compounds within each independent gas stream includes flowing each independent gas stream through at least one of an oxidation device or a wet scrubber column respectively disposed in each independent flow path.

20. The method of claim 18, further comprising:
diverting a first gas stream of the independent gas streams from a primary flow path of a first independent flow path of the independent flow paths to a redundant flow path of the first independent flow path, wherein the redundant flow path is disposed within the housing and includes one or more destruction or removal devices to at least partially abate compounds within the independent gas stream flowing through the redundant flow path.

* * * * *